United States Patent
Yamakawa (10) Patent No.: US 8,135,369 B2
(45) Date of Patent: Mar. 13, 2012

(54) COMMUNICATION DEVICE

(75) Inventor: Junjirou Yamakawa, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 613 days.

(21) Appl. No.: 12/289,785

(22) Filed: Nov. 4, 2008

(65) Prior Publication Data
US 2009/0135801 A1 May 28, 2009

(30) Foreign Application Priority Data
Nov. 27, 2007 (JP) ................................ 2007-305831

(51) Int. Cl.
H04B 7/00 (2006.01)

(52) U.S. Cl. ..................................... 455/249.1; 327/308

(58) Field of Classification Search ............... 455/249.1; 327/308
See application file for complete search history.

(56) References Cited

U.S. PATENT DOCUMENTS

| 4,438,415 | A | * | 3/1984 | Hopfer | 333/81 A |
| 4,488,007 | A | * | 12/1984 | Chataignon et al. | 379/395 |
| 5,157,323 | A | | 10/1992 | Ali et al. | 323/369 |
| 5,337,198 | A | * | 8/1994 | Nishiyama et al. | 360/65 |
| 5,563,557 | A | * | 10/1996 | Sasaki | 333/81 R |
| 5,796,286 | A | * | 8/1998 | Otaka | 327/308 |
| 5,978,415 | A | * | 11/1999 | Kobayashi et al. | 375/230 |
| 6,094,055 | A | * | 7/2000 | Dosdall et al. | 324/601 |
| 7,477,085 | B2 | * | 1/2009 | Stevenson | 327/308 |
| 7,663,420 | B2 | * | 2/2010 | Araki et al. | 327/308 |
| 7,742,543 | B2 | * | 6/2010 | Maeda | 375/302 |
| 2005/0003784 | A1 | * | 1/2005 | Inamori et al. | 455/249.1 |
| 2006/0170517 | A1 | * | 8/2006 | Nakamura et al. | 333/126 |
| 2009/0085579 | A1 | * | 4/2009 | Takeuchi et al. | 324/555 |

FOREIGN PATENT DOCUMENTS

| JP | 62-93814 U | 6/1987 |
| JP | 62-93814(U) | 6/1987 |
| JP | 06-112767 A | 4/1994 |
| JP | 06-112767 (A) | 4/1994 |
| JP | 10-215128 A | 8/1998 |
| JP | 10-215128 (A) | 8/1998 |
| JP | 2000-286659 | 10/2000 |
| JP | 2002-271159 A | 9/2002 |
| JP | 2002-271159 (A) | 9/2002 |

OTHER PUBLICATIONS http://www.mwave-lab.jp/vr_att.htm Retrieved on Oct. 30, 2008.
Japanese Office Action dated Aug. 23, 2011 (with an English translation).
Decision of Refusal dated Nov. 8, 2011 (with an English translation).

* cited by examiner

*Primary Examiner* — Thomas J Hiltunen
(74) *Attorney, Agent, or Firm* — McGinn IP Law Group, PLLC (57) ABSTRACT

The attenuation characteristics of an attenuator largely changes depending on the frequency of an input signal. Accordingly, a difference between the amounts of attenuation of gains of each two attenuators included in a communication device is not constant. In communications using the wireless USB, the difference needs to be in a range of 2 dB±1 dB. Thus, the communication device does not meet the standards of the wireless USB unless the difference between the amounts of attenuation of the attenuators is adjusted. In this regard, provided is a communication device including first and second attenuators that attenuate a signal. The second attenuator is provided with a regulator circuit that adjusts a relation between an amount of attenuation of the signal through the first attenuator and an amount of attenuation of the signal through the second attenuator.

9 Claims, 10 Drawing Sheets

COMMUNICATION DEVICE

BACKGROUND OF THE INVENTION

1. Field of the Invention

The present invention relates to a communication device, and more particularly to a communication device provided with an attenuator that attenuates a gain of an input signal.

2. Description of the Related Art

Figure 1:
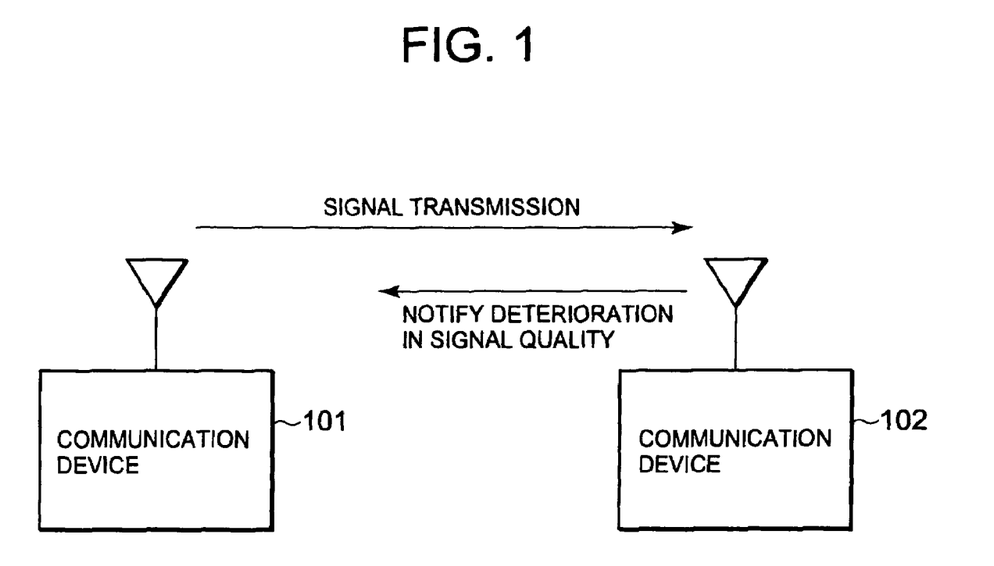
FIG. 1 is a view showing multiple communication devices performing communications.

In an ultra-wideband (UWB) communication system that performs communications by using a wideband and high-frequency signal, signals having a wide range of frequencies can be used to perform communications. Accordingly, in this UWB communication system, communications are performed while hopping frequencies used by respective communication devices. FIG. 1 schematically shows a state where a communication device 101 and a communication device 102 perform communications. For example, consider a case where the communication device 101 transmits a signal to the communication device 102 while hopping frequencies used. Here, assume that noise or the like is mixed in the signal from the communication device 101 due to an influence from another communication device to thereby deteriorate quality of the signal. Such a case may be found when a mobile communication terminal such as a cellular phone performs communications near any of the communication devices, for example. In that case, the communication device 102 detects the deterioration in quality of the signal transmitted from the communication device 101 by use of an amount of noise included in a received signal, and then transmits a signal indicating the information to the communication device 101. The communication device 101 acquires the information on the deterioration in quality of the transmitted signal from the signal that is transmitted from the communication device 102. Here, there is known a method of suppressing deterioration in quality of the signal by attenuating a gain of a signal to be transmitted in that case. In this method, the communication device 101 once attenuates the gain of the signal to be transmitted and then transmits the signal to be transmitted again to the communication device 102.

For this reason, each of the communication devices 101 and 102 is provided with an attenuator that is a circuit for attenuating the gain of the signal to be transmitted. Here, http://www.mwave-lab.jp/vr_att.htm (Non-patent Document 1) discloses a technique to include multiple attenuators and switch the attenuators by a switch to adjust the gain of a signal to be transmitted. Specifically, each of the communication devices 101 and 102 includes multiple attenuators having different amounts of attenuation of the gain of a signal. The communication devices 101 and 102 each select one of the attenuators as necessary to transmit a signal to be transmitted while attenuating the gain of the signal with an appropriate amount of attenuation.

Figure 2:
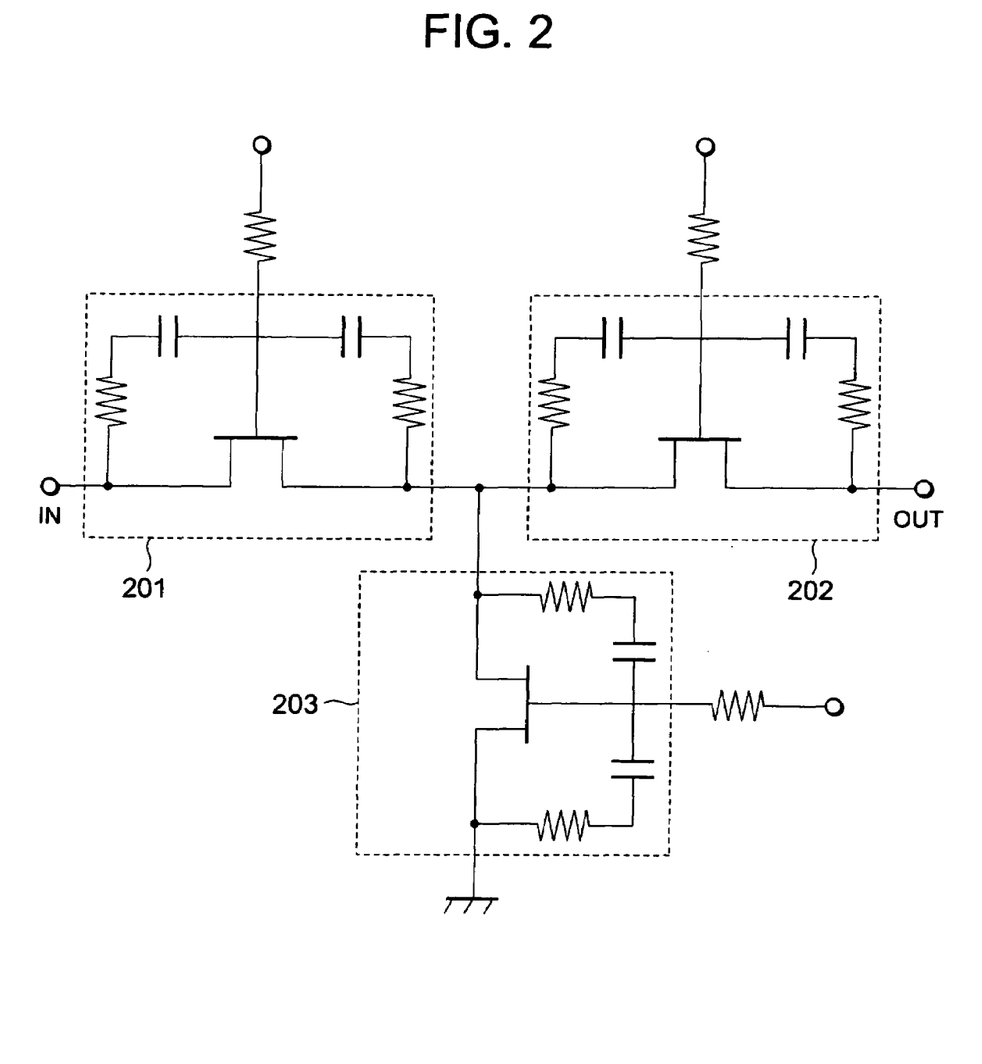
FIG. 2 is a view showing a circuit configuration of a T-type attenuator according to Patent Document 1.

Meanwhile, there is also known an attenuator disclosed in Japanese Unexamined Patent Application Publication No. Hei 6-334504 (Patent Document 1), which implements a concrete circuit configuration of the above-described attenuator. FIG. 2 shows the circuit configuration of the attenuator disclosed in Patent Document 1. This attenuator is a T-type attenuator formed of a circuit in which field effect transistors (FETs) 201 and 202 are connected in series and another FET 203 is connected thereto in shunt. When a path between a source and a drain of the FET 203 is conducted by adjusting a gate voltage, a signal inputted from an input terminal (IN) of the attenuator is shunted into a component that passes through the FET 202 and a component that passes through the FET 203. As a result, the gain of a signal outputted from an output terminal (OUT) is attenuated.

Here, it is known that the amount of attenuation of the gain of the attenuator changes depending on the frequency of the input signal. Specifically, the amount of attenuation of the gain of the attenuator has a frequency characteristic. The reason that the amount of attenuation of the gain of the attenuator has the frequency characteristic is that the respective circuit elements constituting the attenuator have parasitic element components. Referring to the FET 201 and the FET 203 in FIG. 2, it is apparent that the FETs 201 and 203 each have a parasitic capacitor and a parasitic resistor. The input signal to the attenuator is also shunted through this parasitic capacitor. Moreover, since impedance of the parasitic capacitor changes depending on the frequency of the input signal, an amount of current to be shunted through the parasitic capacitor changes depending on the frequency of the input signal to the attenuator. As the input signal to the attenuator leaks through the parasitic capacitor in an amount corresponding to the frequency of the input signal, an amount of current to be outputted from the attenuator also varies depending on the frequency of the input signal. If the amount of current to be outputted from the attenuator varies depending on the frequency of the input signal, the gain of the signal to be outputted from the attenuator also varies depending on the frequency. As a consequence, the amount of attenuation of the gain for the input signal to the attenuator has the frequency characteristic.

Figure 3:
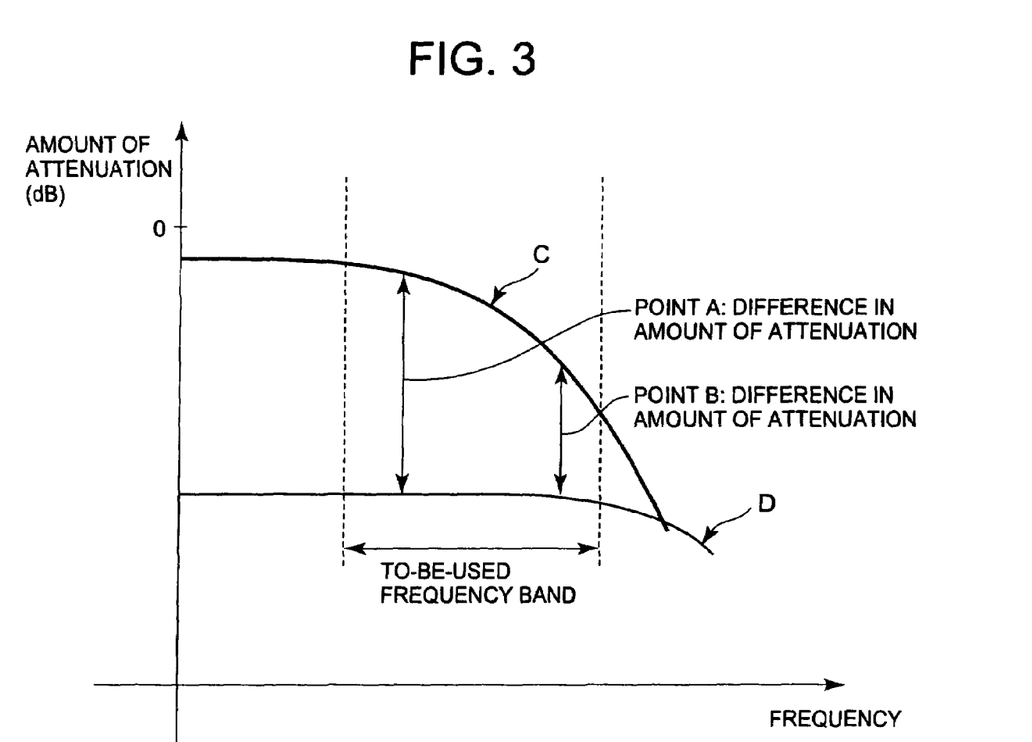
FIG. 3 is a graph showing a difference in attenuation characteristics between two attenuators.

The present inventor has found out the following problems of the above-mentioned conventional techniques. In recent years, communications using a wireless USB (universal serial bus) applying a UWB communication system has been drawing attention. In the communications using the wireless USB, in accordance with the standard thereof, a difference between the amounts of attenuation of gains of each two attenuators included in a communication device needs to satisfy a range of 2 dB±1 dB within a frequency band used by the wireless USB. For example, assume a case where a communication device is provided with four attenuators ATT1 to ATT4 having different amounts of attenuation of gains and the communication device uses these attenuators ATT1 to ATT4 by switching these attenuators with one another. In this case, a difference between the amounts of attenuation of the gains that the attenuators ATT1 and ATT2 respectively have, a difference between the amounts of attenuation of the gains that the attenuators ATT2 and ATT3 respectively have, and a difference between the amounts of attenuation of the gains that the attenuators ATT3 and ATT4 respectively have need to satisfy the range of 2 dB±1 dB within the frequency band used by the wireless USB. However, as described previously, each attenuator has the considerably variable amount of attenuation of the gain depending on the frequency of the input signal. Accordingly, the difference in the amount of attenuation of the gains between each two attenuators is generally not constant within the frequency band used by the wireless USB. A concrete example is shown in FIG. 3. FIG. 3 shows frequency dependency of the amount of attenuation of the gain of the attenuator. The longitudinal axis indicates the amount of attenuation while the lateral axis indicates the frequency of the input signal. Meanwhile, a "to-be-used frequency band" in the graph indicates the frequency range used by the wireless USB. Here, a curved line C shows an attenuation characteristic of the attenuator ATT1 included in the communication device while a curved line D shows an attenuation characteristic of the attenuator ATT2 included in the communication device, for example. It is apparent that the curved line C and the curved line D have different change ratios for the change in the frequency of the input signal. As a consequence, the difference between the amount of attenuation of the gain of the attenuator ATT1 and the amount of attenuation of the gain of the attenuator ATT2 at a point A diverges considerably from the difference between the amount of attenuation of the gain of the attenuator ATT1 and the amount of attenuation of the gain of the attenuator ATT2 at a point B. Accordingly, in the example shown in FIG. 3, the difference between the amounts of attenuation of the gains of the attenuators ATT1 and ATT2 is not constant in the to-be-used frequency band, the attenuator ATT1 having the attenuation characteristic indicated with the curved line C and the attenuator ATT2 having the attenuation characteristic indicated with the curved line D. If these attenuators ATT1 and ATT2 are used in the communication device based on the wireless USB, there arises a problem that the communication device does not meet the standards of the wireless USB.

SUMMARY

A communication device according to the present invention includes first and second attenuators that attenuate a signal. The second attenuator includes a regulator circuit to adjust a relation between an amount of attenuation of the signal through the first attenuator and an amount of attenuation of the signal through the second attenuator. When designing the communication device, a circuit designer is able to adjust a difference in the amount of attenuation of the signal through the first and second attenuators by using this regulator circuit.

According to the present invention, the circuit designer is able to adjust the difference between the amount of attenuation of the signal of an attenuator and that of another attenuator, the attenuators being included in a communication device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 4:
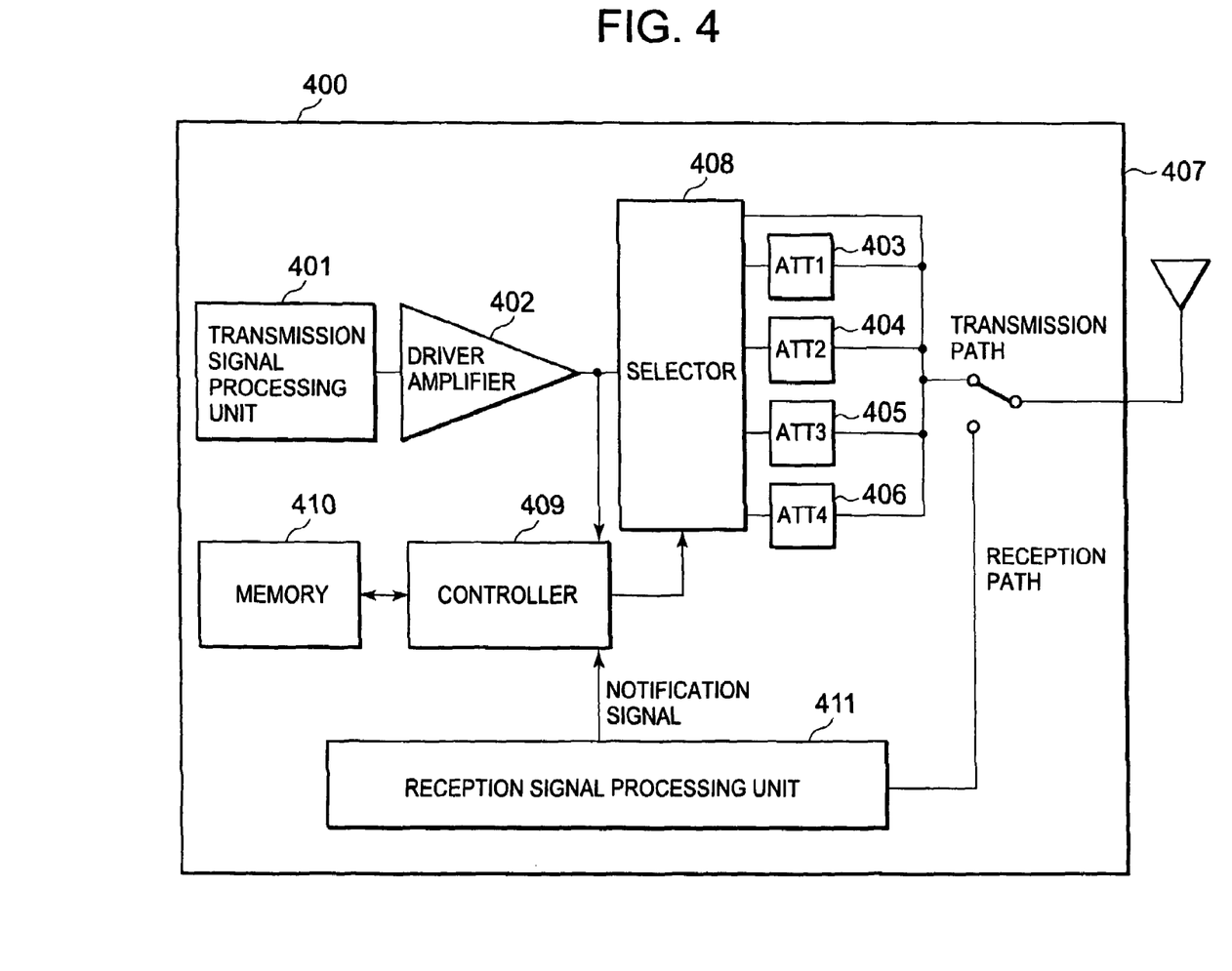
FIG. 4 is a view showing a configuration of a communication device of the present invention.

An embodiment of the present invention will be described below with reference to the accompanying drawings. FIG. 4 shows a configuration of a communication device 400 according to an embodiment of the present invention. The communication device 400 includes: a transmission signal processing unit 401 that performs signal processing such as digital baseband processing or modulation processing on a transmission side; a driver amplifier 402 that amplifies a signal outputted from the transmission signal processing unit 401; and a reception signal processing unit 411 that performs signal processing such as digital baseband processing or modulation processing on a reception side. The signal outputted from the driver amplifier 402 is either outputted directly from an antenna 407 or outputted from the antenna 407 after being passed through any of attenuators 403 to 406 (ATT1 to ATT4). For example, it is possible to design the attenuators ATT1 to ATT4 to have various amounts of attenuation of gains of the signal in the descending order. A selector 408 determines a passage of transmitting, to the antenna 407, the signal outputted from the driver amplifier 402 on the basis of an instruction from a controller 409. When the controller 409 receives a notification signal that notifies the controller 409 of deterioration in quality of the signal transmitted from the controller 409 through a reception passage and the reception signal processing unit 411, the controller 409 determines the amount of attenuation of the gain of the signal to be transmitted on the basis of the output from the driver amplifier 402 and the amounts of attenuation of the gains of the attenuators ATT1 to ATT4, which are written in a memory 410 in advance. Then, the controller 409 sends an instruction to the selector 408 so that the selector 408 can select an appropriate attenuator to achieve the necessary amount of attenuation of the gain. The antenna 407 receives the signal with the attenuated gain from any one of the attenuators ATT1 to ATT4 and the outputs the signal. Here, the memory 410 stores information as to which attenuator has how much amount of attenuation at which frequency. Note that, whether or not the quality of the signal deteriorates is judged by a different communication device serving as a communication counterpart of the communication device 400. The notification signal mentioned above is also transmitted from the above-described different communication device to the communication device 400. One method of judging the deterioration in quality is to use a signal-to-noise ratio of a reception signal, for example. The different communication device transmits the notification signal to the communication device 400 when the signal-to-noise ratio deteriorates to a predetermined degree.

Figure 5:
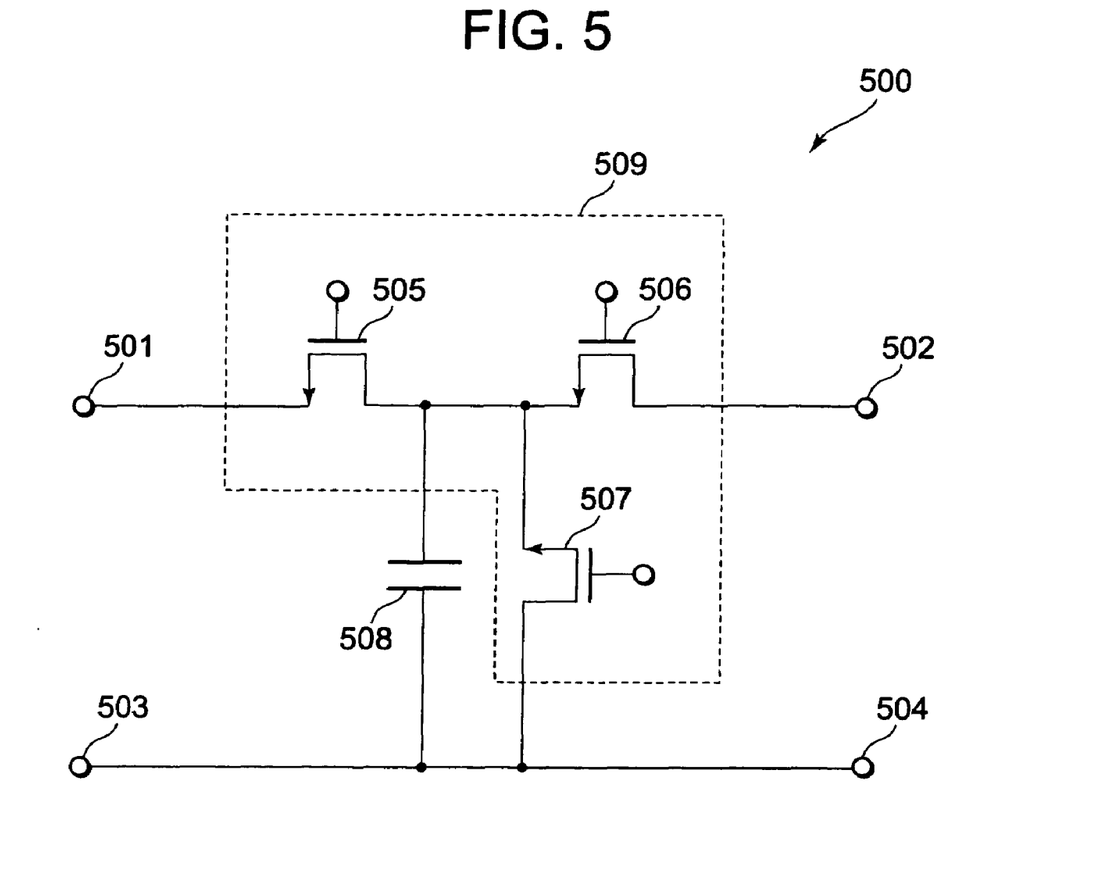
FIG. 5 is a view showing a configuration of an attenuator including a capacitance element serving as a regulator circuit.

Next, FIG. 5 shows an attenuator used in the communication device 400 according to this embodiment. FIG. 5 shows an attenuator 500 used in the communication device. The attenuator 500 is a two-terminal pair network (two-port circuit) which includes circuit elements between ports formed of terminals 501 and 503 and ports formed of terminals 502 and 504. In the attenuator 500, metal-oxide-semiconductor (MOS) transistors 505 and 506, which are a type of field-effect transistors, are connected in series between the terminal 501 and the terminal 502 as an example of a first circuit and a second circuit. Moreover, the attenuator 500 includes a MOS transistor 507 connected in shunt between the MOS transistors 505 and 506. Here, a circuit 509 formed of the MOS transistors 505 to 507 is a general T-type attenuator formed of the MOS transistors. Moreover, a capacitance element 508 is connected in shunt between the MOS transistors 505 and 506 relative to the T-type attenuator. Since the MOS transistor 507 and the capacitance element 508 serve as shunt components in the two terminal pair network, they are also connected to an interconnection that connects between the terminal 503 and the terminal 504. A value of the capacitance element 508 may be set to 20 [fF], for example. These MOS transistors are usually formed of n-type MOS transistors. However, p-type MOS transistors are also applicable. Moreover, each of the MOS transistors 505 to 507 includes a gate terminal.

Figure 6:
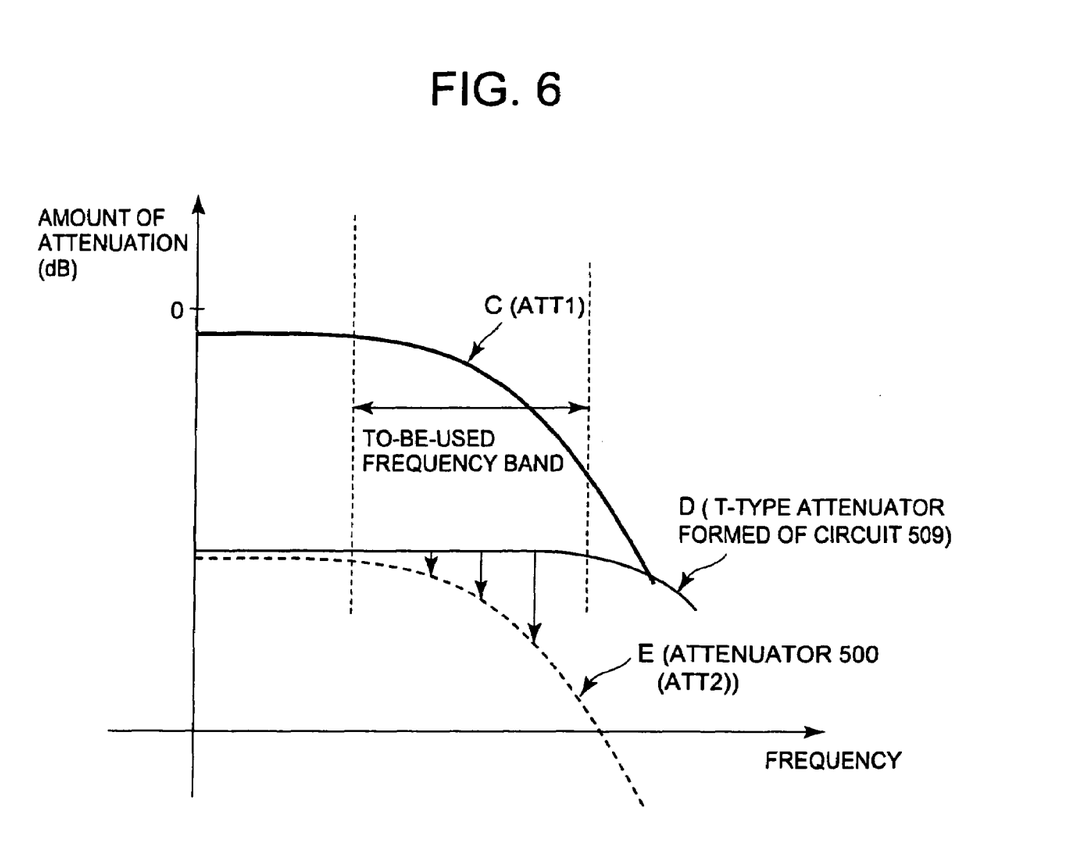
FIG. 6 is a graph showing variation in attenuation characteristics in the case of using the attenuator including the capacitance element serving as the regulator circuit.

FIG. 6 shows how the attenuation characteristic changes when the attenuator 500 shown in FIG. 5 is used. The longitudinal axis shows an amount of attenuation while the lateral axis shows the frequency. Here, a range of the frequency used in communications is indicated as a "to-be-used frequency band". Now, among the attenuators included in the communication device 400 shown in FIG. 4, the attenuator ATT1 is assumed to have an attenuation characteristic C. Then, a T-type attenuator formed of the circuit 509 in FIG. 5 is assumed to have an attenuation characteristic D. In this case, if the T-type attenuator formed of the circuit 509 is applied to the attenuator ATT2 in the communication device 400, the difference in the amount of attenuation between the attenuators ATT1 and ATT2 significantly varies in the to-be-used frequency band. Accordingly, assume that the attenuator 500 shown in FIG. 5, in which the shunt capacitor 508 is added to the T-type attenuator formed of the circuit 509, is used as the attenuator ATT2. This attenuator 500 has an attenuation characteristic E. In the attenuator 500, the shunt capacitor 508 is connected between the MOS transistors 505 and 506 in the T-type attenuator formed of the circuit 509. For this reason, in the case of the attenuator 500, a shunt component of an input signal is increased whereas an amount of current of an output signal is decreased in comparison with the T-type attenuator formed of the circuit 509. As a consequence, the attenuator 500 attenuates the gain of the input signal more greatly than the T-type attenuator formed of the circuit 509. Moreover, the attenuation of the gain of the input signal by this shunt capacitor 508 becomes greater as the input signal has a higher frequency. This is attributable to a fact that impedance of the shunt capacitor 508 is attenuated in accordance with the increase in the frequency of the input signal whereby the current component to be shunted through the shunt capacitor 508 is increased. In other words, it is possible to say that the shunt capacitor 508 is a regulator circuit for adjusting the amount of attenuation of the gain of the input signal. A circuit designer evaluates the attenuation characteristic while changing the capacitance value of the shunt capacitor 508, and determines the capacitance value that achieves the attenuation characteristic by which the difference in the amount of attenuation relative to the attenuation characteristic C is made constant within the to-be-used frequency band. Thereafter, the circuit designer is able to use the attenuator 500 including the inserted shunt capacitor 508 having the determined capacitance value as the attenuator ATT2 in the communication device 400. As a result, the difference in the amount of attenuation becomes constant between the attenuators ATT1 and ATT2 within the to-be-used frequency band.

The description has been made above regarding the concept of applying the attenuator 500 shown in FIG. 5 to the attenuator ATT2 in order to achieve the constant difference in the amount of attenuation of the gains between the attenuators ATT1 and ATT2 on the assumption that the attenuator ATT1 included in the communication device 400 has the attenuation characteristic C. Similarly, in order to achieve the constant difference in the amount of attenuation of the gains between the attenuators ATT2 and ATT3 included in the communication device 400, it is also possible to further apply the attenuator 500 shown in FIG. 5 to the attenuator ATT3. In that case, the shunt capacitor 508 is appropriately determined to achieve the constant difference in the amount of attenuation of the gains between the attenuators ATT2 and ATT3 in the to-be-used frequency band, and the attenuator 500 applying the shunt capacitor 508 having that capacitance value may be used as the attenuator AAT3. Similarly, it is also possible to use the attenuator 500 as the attenuator ATT4 when achieving the constant difference in the amount of attenuation of the gains between the attenuators ATT3 and ATT4.

Figure 7:
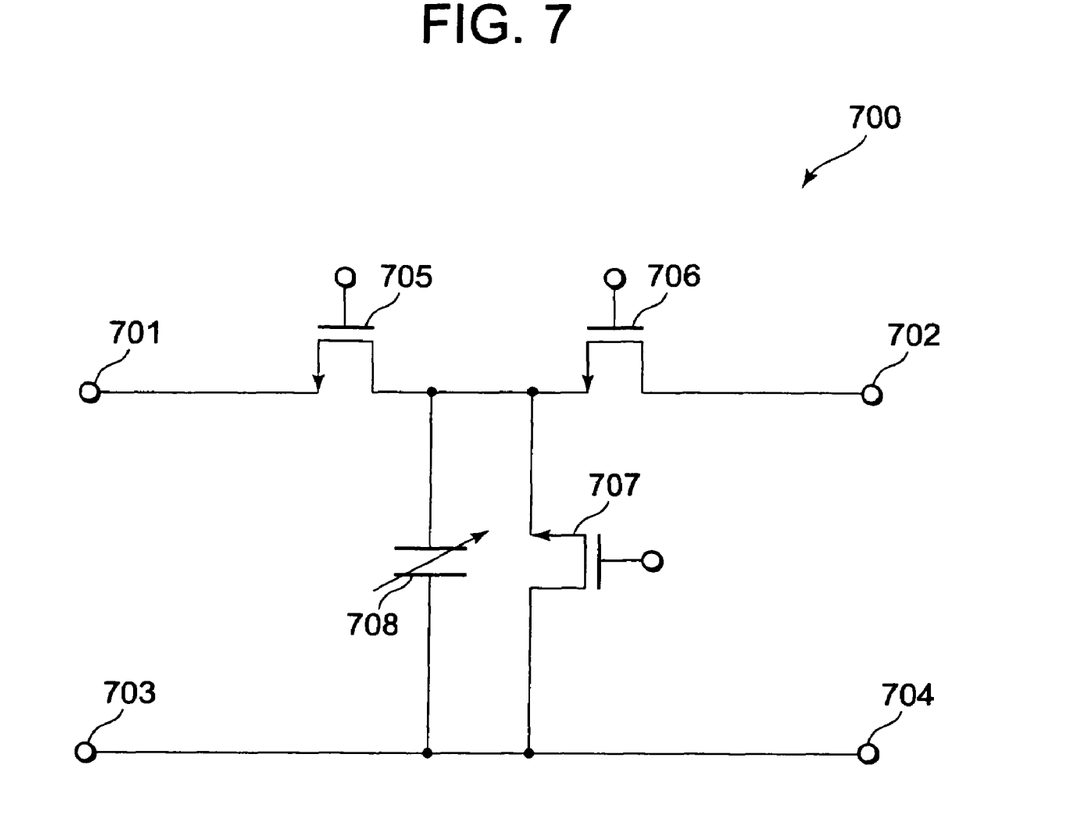
FIG. 7 is a view showing another configuration of an attenuator including a capacitance element serving as the regulator circuit.

FIG. 7 shows an attenuator 700 which is formed by replacing the capacitance element 508 in the attenuator 500 according to FIG. 5 with a variable capacitance element 708. Among circuit elements in the attenuator 700, the configurations other than the variable capacitance element 708 are similar to those in the attenuator 500. The circuit designer applies the attenuator 700, for example, to the attenuator ATT2 out of the attenuators ATT1 and ATT2 included in the communication device 400. Then, the difference in the attenuation characteristic between the attenuators ATT1 and ATT2 is evaluated while changing the capacitance value of the variable capacitance element 708. The circuit designer determines an appropriate capacitance value that achieves the constant difference in the to-be-used frequency band that covers the frequencies used in the communications. Similarly, it is also possible to adjust the difference in the amount of attenuation between the attenuators ATT3 and ATT4 included in the communication device 400 by using the attenuator 700.

Figure 8:
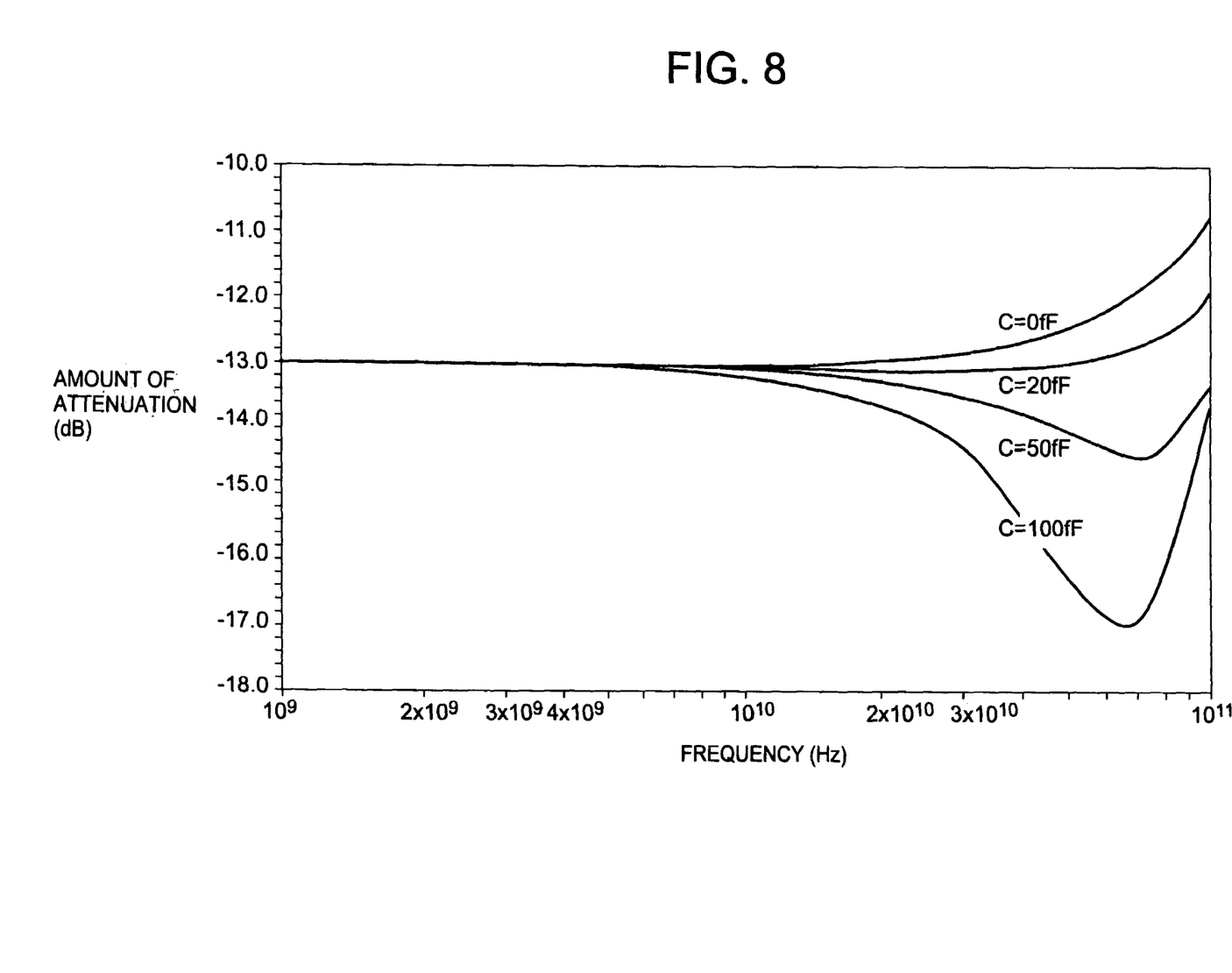
FIG. 8 is a graph showing variation in attenuation characteristics in the case of changing a capacitance value of the capacitance element serving as the regulator circuit.

FIG. 8 shows variation in the attenuation characteristic of the attenuator 700 in the case of setting each gate width of MOS transistors 705 and 706 to 13.5 [µm], setting a gate width of a MOS transistor 707 to 18.2 [µm], and changing the capacitance value of the variable capacitance element 708 to 0 [fF], 20 [fF], 50 [fF], and 100 [fF], the MOS transistors 705 to 707 and the variable capacitance element 708 constituting the attenuator 700 according to FIG. 7. As apparent from FIG. 8, it is possible to adjust the attenuation characteristic of the attenuator 700 by changing the capacitance value of the variable capacitance element 708.

Figure 9:
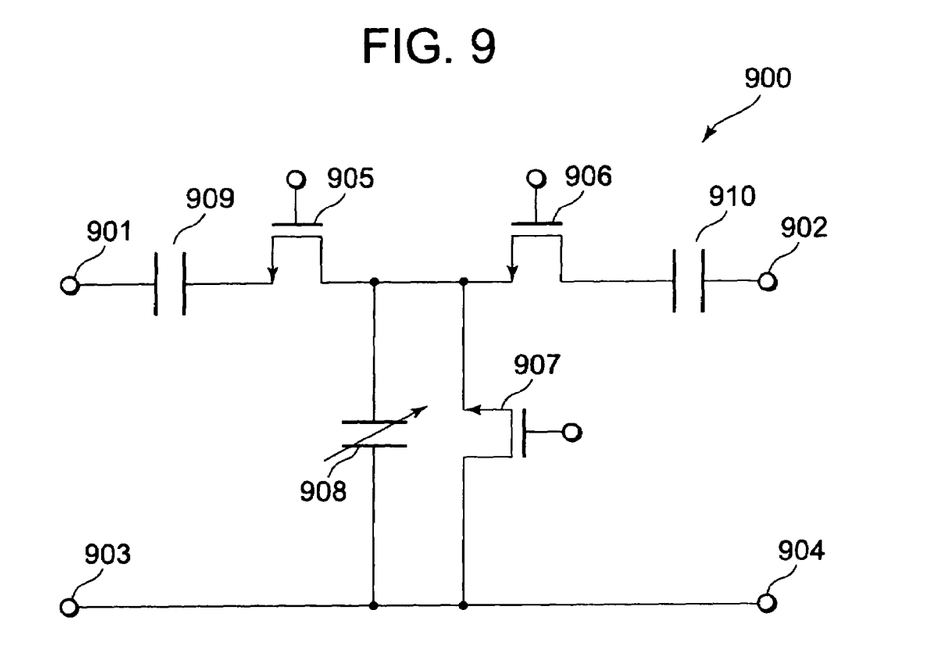
FIG. 9 is a view showing another configuration of an attenuator including capacitance elements serving as the regulator circuits.

FIG. 9 shows an attenuator 900 in which two more capacitance elements are further added to the attenuator 700 shown in FIG. 7. This attenuator 900 is applicable to each of the attenuators in the communication device 400 shown in FIG. 4. The attenuator 900 includes MOS transistors 905, 906, and 907 as well as a variable capacitance element 908, which are circuit elements similar to those in the attenuator 700 in FIG. 7. Moreover, the attenuator 900 includes additional capacitance elements 909 and 910. The attenuator 900 includes the capacitance elements 909 and 910 in addition to the capacitance element 908. Accordingly, an influence on the attenuation characteristic, which is caused when the capacitance values of these capacitance elements vary at the time of manufacturing the attenuator 900, can be reduced. Technically, the attenuation characteristic of the attenuator can be obtained by analyzing the frequency characteristic of S12 and S21 that are diagonal elements of a scattering matrix (S matrix). Here, one of the parameters that exert a large influence on the values of these S12 and S21 is the capacitance value of the capacitance element. Therefore, the attenuator 900 is provided with multiple capacitance elements in the circuit so that a change caused by variation in the capacitance elements of S12 or S21 that are the diagonal elements of the scattering matrix can be reduced. Specifically, S12 and S21 are fractional parameters. Thus, by providing the multiple capacitance elements in the circuit, terms that change depending on the capacitance value are included in both a denominator and a numerator of S12 or S21. Accordingly, even when the capacitance elements 908, 909, and 910 vary at the time of manufacturing the respective elements, the change in S12 or S21 is canceled out by a change in the denominator and a change in the numerator. As a consequence, the attenuation characteristic that can be obtained from S12 or S21 does not largely change by the variation of the capacitance values of the capacitance elements 908, 909, and 910 at the time of manufacturing.

Figure 10:
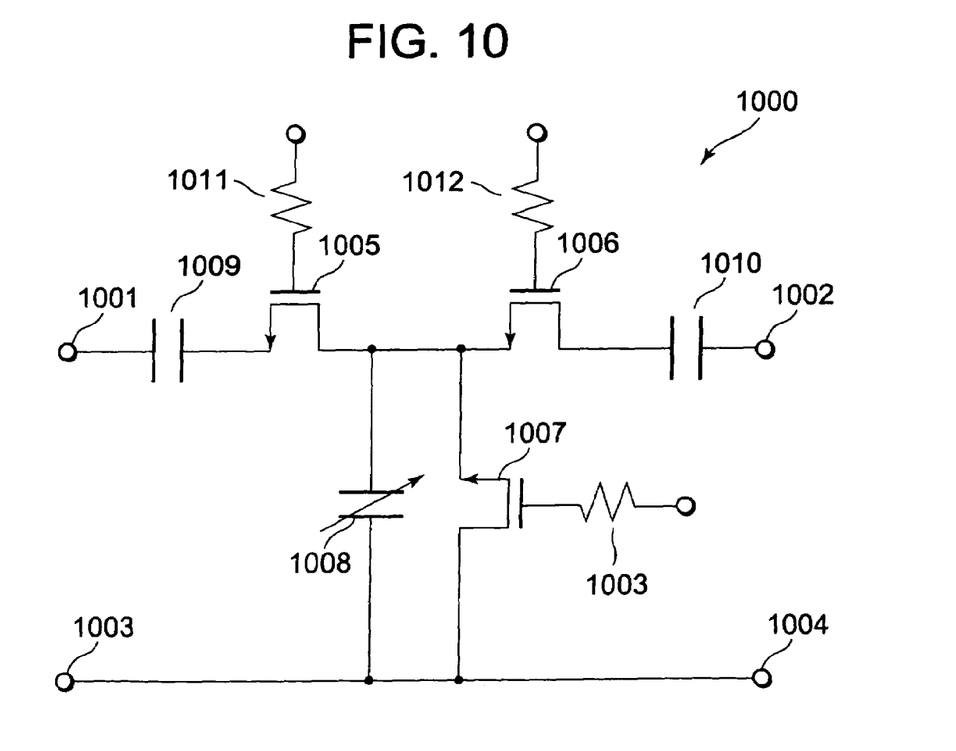
FIG. 10 is a view showing still another configuration of an attenuator including capacitance elements serving as the regulator circuits.

FIG. 10 shows an attenuator 1000 having a different circuit configuration. The circuit designer can also apply this attenuator 1000 to each of the attenuators included in the communication device 400. In this attenuator 1000, resistors 1011, 1012, and 1013 are respectively connected to gate electrodes of MOS transistors 1005, 1006, and 1007 which constitute the attenuator 1000. Resistance values of the resistors 1011, 1012, and 1013 are respectively set to 1 [kΩ], for instance. By connecting the resistors respectively to the gate electrodes of the MOS transistors 1005, 1006, and 1007, it is possible to prevent leakage of the input signal received at a terminal 1001 respectively through gate interconnections of the MOS transistors 1005, 1006, and 1007. This is because values of leak currents can be suppressed to low levels by high resistance values of the resistors 1011, 1012, and 1013. Note that, the attenuator 1000 shown in FIG. 10 includes capacitance elements 1009 and 1010. However, these capacitance elements exert similar effects to those of the capacitance elements 909 and 910 included in the attenuator 900 according to FIG. 9. Thus, these elements are not essential components for preventing the leakage of the input signal received at a terminal 901 respectively through the gate lines of the MOS transistors 905, 906, and 906.

Figure 11:
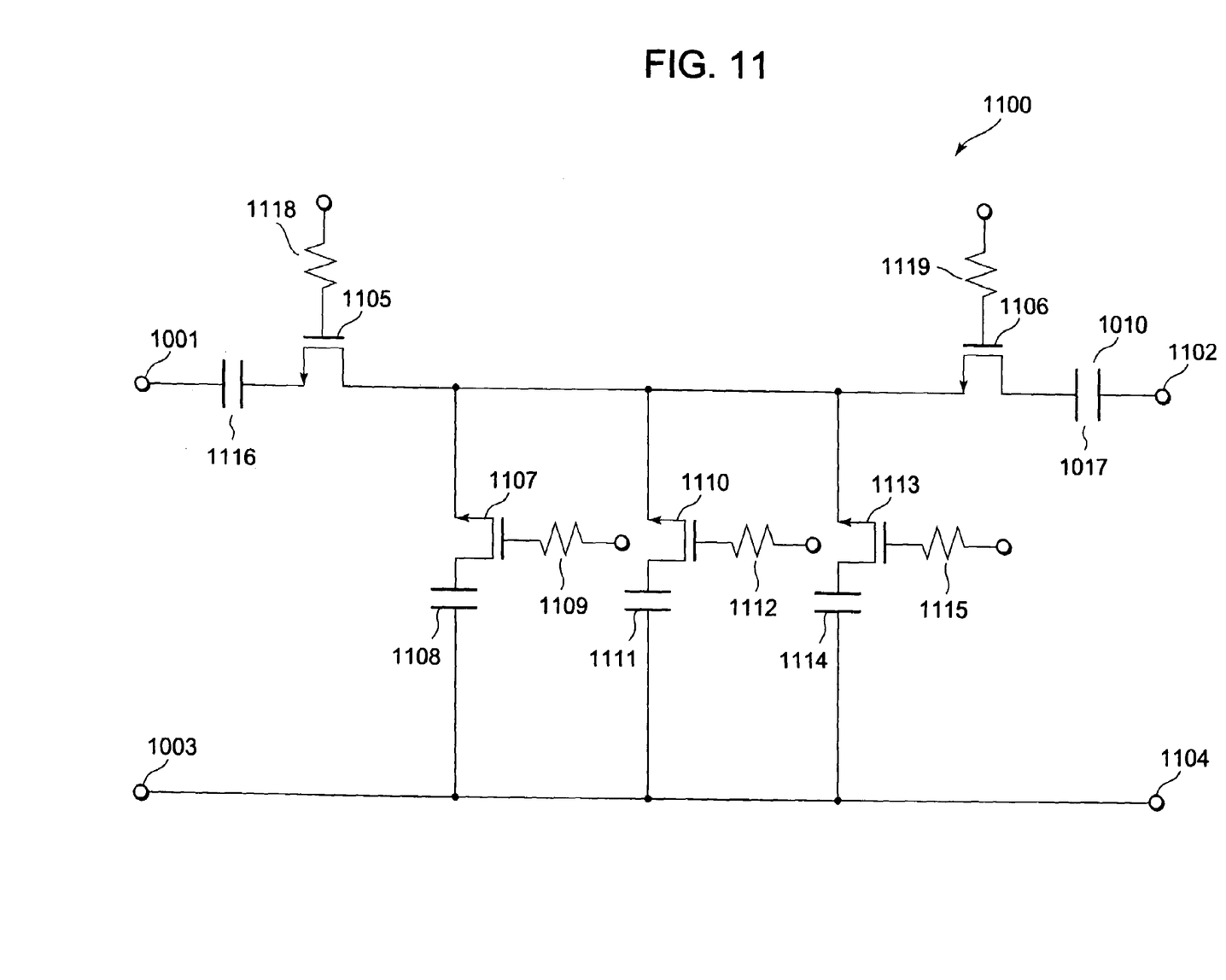
FIG. 11 is a view showing yet another configuration of an attenuator including capacitance elements serving as the regulator circuits.

FIG. 11 shows an attenuator 1100 in which the function of a variable capacitance element 1008 in the attenuator 1000 according to FIG. 10 is achieved by a MOS transistor. The circuit designer can apply this attenuator 1100 to each of the attenuators in the communication device 400. The attenuator 1100 shown in FIG. 11 includes MOS transistors 1107, 1110, and 1113 and capacitance elements 1108, 1111, and 1114 that are respectively connected in series to these MOS transistors 1107, 1110, and 1113. The voltage to be applied to each of the gate electrodes of the MOS transistors 1107, 1110, and 1113 is controlled to thereby change the number of the MOS transistors in which the source and the drain are conducted with each other, thus realizing the variable capacitance element. The large number of the MOS transistors among the MOS transistors 1107, 1110, and 1113 in which the source and the drain are conducted with each other, makes the input signal component to be shunted large. This equivalently means that the capacitance value of the variable capacitance element 1008 in FIG. 10 increases. On the contrary, the small number of the MOS transistors among the MOS transistors 1107, 1110, and 1113 in which the source and the drain are conducted with each other, makes the input signal component to be shunted small. This equivalently means that the capacitance value of the variable capacitance element 1008 in FIG. 10 decreases. Note that, in FIG. 11, the three MOS transistors 1107, 1110, and 1113 contribute to realize the equivalent variable capacitance element, and the three capacitance elements 1108, 1111 and 1114 contribute to realize the equivalent variable capacitance element. However, the number of the MOS transistors and that of the capacitance elements are not limited to three. For example, the circuit designer can select the number of the MOS transistors and that of the capacitance elements appropriately depending on the range of the capacitance value to be changed. Further, capacitance elements 1116 and 1117 exhibit the same effect as that of the capacitance elements 909 and 910 included in the attenuator 900 according to FIG. 9, and are not essential components to realize the equivalent variable capacitance. Furthermore, resistances 1118 and 1119 exhibit the same effect as that of the resistances 1011 and 1013 included in the attenuator 1000 according to FIG. 10, and are not essential components to realize the equivalent variable capacitance.

By using the attenuator described above, the circuit designer can adjust the amounts of attenuation by the respective attenuators included in the communication device and also to adjust the differences in the amounts of attenuation among the respective attenuators. Note that, in FIG. 10, the resistors 1011, 1012, and 1013 are provided together with the capacitors 1009 and 1010 that are provided in order to reduce the effect of the amount of attenuation caused by the variation at the time of manufacturing the capacitors. Here, it is also possible to apply only the resistors 1011, 1012, and 1013 to the attenuator 500 shown in FIG. 5 or the attenuator 700 shown in FIG. 7. Meanwhile, in FIG. 11, in addition to the capacitors 1116 and 1117 provided for reducing the effect of the amount of attenuation caused by the variation at the time of manufacturing the capacitors, and the resistors 1109, 1112, 1113, 1118, and 1119 for preventing the leak current of the MOS transistors to the gate interconnections, there are provided the MOS transistors 1107, 1110, and 1113, and the capacitance elements 1108, 1111, and 1114 that are connected in series to the respective MOS transistors 1107, 1110, and 1113. Alternatively, it is also possible to apply the MOS transistors 1107, 1110, and 1113 as well as the capacitance elements 1108, 1111, and 1114 respectively connected in series to these MOS transistors 1107, 1110, and 1113 to the shunt capacitor 508 of the attenuator 500 shown in FIG. 5 or to the shunt capacitor 708 of the attenuator 700 shown in FIG. 7.

It is apparent that the present invention is not limited to the above embodiments, but may be modified and changed without departing from the scope and spirit of the invention.

What is claimed is:
1. A communication device, comprising:
first and second attenuators that attenuate a signal;
a regulator circuit that makes adjustment of a relation between an amount of attenuation of the signal through the first attenuator and an amount of attenuation of the signal through the second attenuator,
wherein the signal includes a frequency usable in communications, and
the regulator circuit adjusts a difference between the amount of attenuation of the signal through the first attenuator and the amount of attenuation of the signal through the second attenuator; and
a switching circuit that switches between the first attenuator and the second attenuator for use in response to a notification signal indicating deterioration in quality of the signal when transmitted.

2. The communication device according to claim 1, wherein
the second attenuator includes:
a T-type two-terminal-pair network that includes first and second circuits connected in series, and a third circuit connected in shunt between the first and second circuits; and
the regulator circuit connected in shunt between the first and second circuits independently from the third circuit.

3. The communication device according to claim 2, wherein
the regulator circuit comprises a capacitance element.

4. The communication device according to claim 3, wherein
the capacitance element has a variable capacitance value.

5. The communication device according to claim 2, wherein
the regulator circuit includes:
a capacitance element; and
a first field effect transistor connected in series to the capacitance element.

6. The communication device according to claim 2, wherein
the first circuit comprises a second field effect transistor, and
a resistor is connected to a gate terminal of the second field effect transistor.

7. The communication device according to claim 2, further comprising:
a capacitance element connected between the first circuit and a first terminal among terminals included in the two-terminal-pair network, the first terminal receiving the signal.

8. The communication device according to claim 1 wherein the first and second attenuators are connected in parallel between an input terminal to which the signal is inputted and an output terminal to output an attenuated signal.

9. The communication device according to claim 1 wherein the first and second attenuators are selectively used on the basis of the amount of attenuation of the signal.

* * * * *